United States Patent
Chen et al.

(10) Patent No.: US 6,664,878 B1
(45) Date of Patent: Dec. 16, 2003

(54) METHOD FOR ASSEMBLING MAGNETIC MEMBERS FOR MAGNETIC RESONANCE IMAGING MAGNETIC FIELD GENERATOR

(75) Inventors: William E-Wei Chen, Florence, SC (US); Jinhua Huang, Florence, SC (US); Ronald Floyd Lochner, Florence, SC (US); Weijun Shen, Florence, SC (US); Geer Ward, Florence, SC (US); Bu-Xin Xu, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/064,565

(22) Filed: Jul. 26, 2002

(51) Int. Cl.⁷ .............................. H01F 7/02; H01F 3/00; G01V 3/00
(52) U.S. Cl. ..................... 335/296; 335/298; 335/306; 324/319
(58) Field of Search ............................. 335/296–306, 335/216; 324/318, 319, 320

(56) References Cited

U.S. PATENT DOCUMENTS

| 4,770,723 A | 9/1988 | Sagawa et al. ............. 148/302 |
| 4,931,760 A | 6/1990 | Yamaguchi et al. ......... 335/306 |
| 5,162,768 A | 11/1992 | McDougall et al. ......... 335/296 |
| 5,309,106 A | 5/1994 | Miyajima et al. ............ 324/318 |
| 6,336,989 B1 | 1/2002 | Aoki et al. ................ 156/275.7 |
| 6,340,888 B1 | 1/2002 | Aoki et al. .................. 324/319 |

FOREIGN PATENT DOCUMENTS

| EP | 0 503 881 B1 | 1/1997 |
| EP | 0 998 876 A1 | 4/1999 |
| EP | 0 978 727 A2 | 2/2000 |
| JP | 06224029 A | 8/1994 |

*Primary Examiner*—Ramon M. Barrera
(74) *Attorney, Agent, or Firm*—Cantor Colburn LLP

(57) ABSTRACT

Disclosed herein is a method for assembling a magnetic field generator for a magnetic resonance imaging system. The method comprises: establishing an arrangement for a permanent magnet of a magnet assembly comprising a ferromagnetic yoke plate and a permanent magnet, wherein the arrangement includes a portion of a cavity formed from placement of a portion of a plurality of retainers attached at substantially the perimeter of the yoke plate. The method also includes populating the first portion of the cavity with a set of rails attached to the yoke plate and affixing a plurality of gliders to a plurality of magnet blocks and magnetizing the gliders and magnet blocks to form a plurality of block assemblies. Finally, the method includes sliding each block assembly of the plurality of block assemblies along a rail of the set of rails; initiating with an outermost rail and concluding with an innermost, securing each successively filled rail with a retainer.

30 Claims, 17 Drawing Sheets

METHOD FOR ASSEMBLING MAGNETIC MEMBERS FOR MAGNETIC RESONANCE IMAGING MAGNETIC FIELD GENERATOR

BACKGROUND OF INVENTION

This invention relates to a magnetic field generator for an MRI, a method for assembling the same, and a method for assembling a magnet unit for the same. More specifically, this invention relates to a magnetic field generator for MRI incorporating permanent magnets, a method for assembling the same, and a method for assembling a magnet unit for the same. It will be appreciated, however, that the-invention is also amenable to other like applications for complex assembly of components exhibiting large interaction forces between the members to be assembled.

A magnetic field generator for MRI uses permanent magnets. The magnets used in such an apparatus are often formulated from a plurality of magnet blocks. It is very difficult to place material blocks first and then magnetize each block. Therefore, in actual manufacturing, the blocks are fabricated and then magnetized. The magnetized blocks are then arranged on a yoke plate so that each of the magnet blocks has a same magnetic pole facing upward. A pole pieces is then placed on the top of the magnetized blocks. Such arrangement on a yoke plate is difficult due to the interaction of the large magnetic forces between each of the magnet blocks and between the blocks, pole piece and the yoke plate.

Conventionally, when placing the magnet blocks on the yoke plate, a surface of the yoke plate is first applied with adhesive, and then magnet blocks are bonded or attached to the surface, as disclosed in the Japanese Patent No. 2,699,250 for example. According to such a bonding method, upper surfaces of respective magnet blocks bonded to the yoke plate surface are not flush with each other, making an uneven surface. A magnetic field generator incorporating the permanent magnets made of such magnet blocks is apt to produce non-uniform magnetic field between a pair of pole piece opposed to each other. Further, pole pieces for correcting the non-uniformity of the magnetic field may be tilted to produce non-uniformity in the magnetic field. Generally, after a step of mounting a pair of permanent magnets to oppose each other, a step of adjustment for uniformly distributing the magnetic field is indispensable. However, if the magnet blocks are mounted according to the above method, the non-uniformity of the magnetic field is so large that the adjustment becomes very time consuming.

Further, according to the above method of bonding the magnet blocks, the magnet blocks each exhibiting very large magnetic forces is placed from above, onto the upper surface of the yoke plate, making it extremely difficult to fit each of the magnet blocks snugly to adjacent magnet blocks. More specifically, when mounting, each magnet block is held with a face of predetermined magnetic pole facing upward. When the magnet block is brought above the other magnet block, which is already fixed onto the yoke plate, a pulling force is generated between the two. Further, when the two magnet blocks are brought in adjacency, a repelling force is generated between the two. Since the magnet block to be placed is under such intense forces, the magnet block must be firmly held for safety while being transported. For a conventional holding mechanism, it is very difficult to fit the magnet block snugly to the place of bonding efficiently against these strong forces.

The pair of magnet units thus assembled as described above is then opposed to each other so the permanent magnets are faced at a predetermined distance. This process is achieved by first assembling one magnet unit, then connecting one or more posts or a yoke column to the magnet unit, and finally connecting the other magnet unit to the post(s).

The post(s) magnetically connect the pair of magnet units, and therefore must be made of a magnetic material. Thus, when the post is connected to the magnet unit, the post is brought under the pulling force from the magnet unit. This large force makes it difficult to connect the two yoke plates with high accuracy. Likewise, when the second magnetic unit is connected to the post already connected to the first magnet unit, it is also difficult to connect the two at a high accuracy.

Another method to assemble a magnetic field generator is disclosed by European Patent No. EP0978727A2 and U.S. Pat. No. 6,336,989. In these patents, a non-magnetic fixed projection is placed at the center of the yoke, with two orthogonal guide rails. The magnetic blocks are then slid into place and bonded to each other along the non-magnetic fixed projection and guide rails. This approach while adequate for its intended purposes is still cumbersome and requires additional special tooling. What is desired is a method for assembling the magnetic field generator to desired tolerances with a minimum of specialized tooling and assembly steps.

SUMMARY OF INVENTION

The above discussed and other drawbacks and deficiencies are overcome or alleviated by a method for assembling a magnetic field generator for a magnetic resonance imaging system. The method comprises: establishing an arrangement for a permanent magnet of a magnet assembly comprising a ferromagnetic yoke plate and a permanent magnet, wherein the arrangement includes a portion of a cavity formed from placement of a portion of a plurality of retainers attached at substantially the perimeter of the yoke plate. The method also includes populating the first portion of the cavity with a set of rails attached to the yoke plate and affixing a plurality of gliders to a plurality of magnet blocks and magnetizing the gliders and magnet blocks to form a plurality of block assemblies. Finally, the method includes sliding each block assembly of the plurality of block assemblies along a rail of the set of rails; initiating with an outermost rail and concluding with an innermost, securing each successively filled rail with a retainer.

Also disclosed herein is a magnetic field generator for a magnetic resonance imaging system. The magnetic field generator comprises: an arrangement for a permanent magnet of a magnet assembly comprising a ferromagnetic yoke plate and a permanent magnet, wherein the arrangement includes a portion of a cavity formed from placement of a portion of a plurality of retainers attached at substantially the perimeter of the yoke plate. The magnetic field generator has the first portion of the cavity populated with a set of rails attached to the yoke plate and a plurality of gliders affixed to a plurality of magnet blocks and magnetized to form a plurality of block assemblies. Each block assembly of the plurality of block assemblies is slid along a rail of the set of rails; initiating with an outermost rail and concluding with an innermost, securing each successively filled rail with a retainer.

Also disclosed herein is a re-workable magnetic field generator for a magnetic resonance imaging system comprising: a means for establishing an arrangement for a permanent magnet of a magnet assembly comprising a ferromagnetic yoke plate and a permanent magnet, wherein the arrangement includes a portion of a cavity formed from placement of a portion of a plurality of retainers attached at substantially the perimeter of the yoke plate. The re-workable magnetic field generator also includes a means for populating the first portion of the cavity with a set of rails attached to the yoke plate and a means for affixing a plurality of gliders to a plurality of magnet blocks and magnetizing the gliders and magnet blocks to form a plurality of block assemblies. Finally, the re-workable magnetic field generator further includes a means for sliding each block assembly of the plurality of block assemblies along a rail of the set of rails; initiating with an outermost rail and concluding with an innermost, securing each successively filled rail with a retainer and a means for removing one or more retainers of the plurality of retainers and sliding each block assembly of the plurality of block assemblies along a rail of the set of rails off the rail and the yoke plate.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures.

DETAILED DESCRIPTION

Disclosed herein is another method and system for assembly of a permanent magnet such as employed in a magnetic field generator for MRI. The method and system employs a series of gliders and rails to guide a plurality of magnet blocks into a desired position on a yoke plate. It should be noted that although the disclosed embodiments are described by way of reference to assembly of a magnetic field generator for MRI applications, it will be appreciated that such references are illustrative only and the disclosed embodiments may be applied to any instance of assembly where there are large interaction forces between the elements to be assembled. Moreover, the references and descriptions herein may apply to many forms of assembly beyond magnets and magnetic blocks including, but not limited to, hybrid permanent/electrical magnet system and the like.

Figure 1:
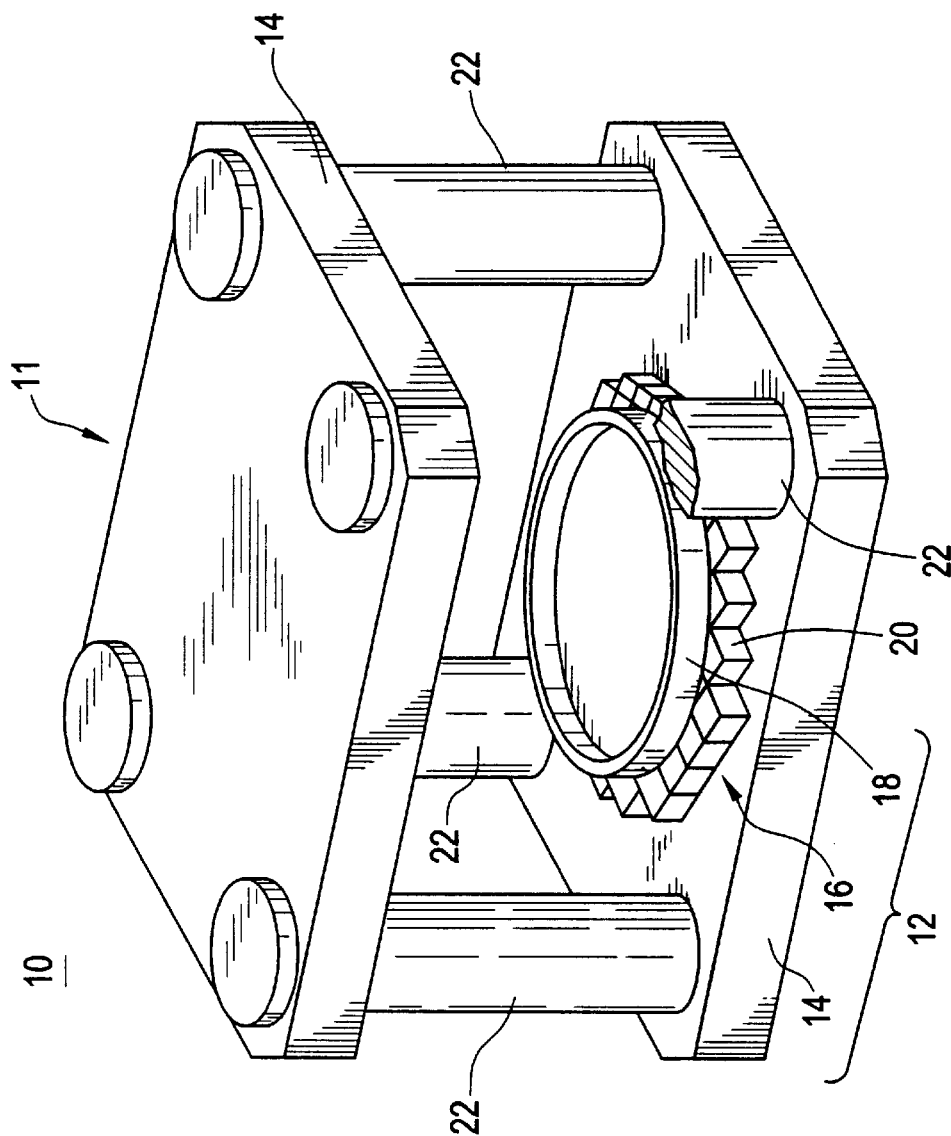
FIG. 1 depicts a cutaway view of an exemplary MRI magnetic field generator assembly.
Figure 2:
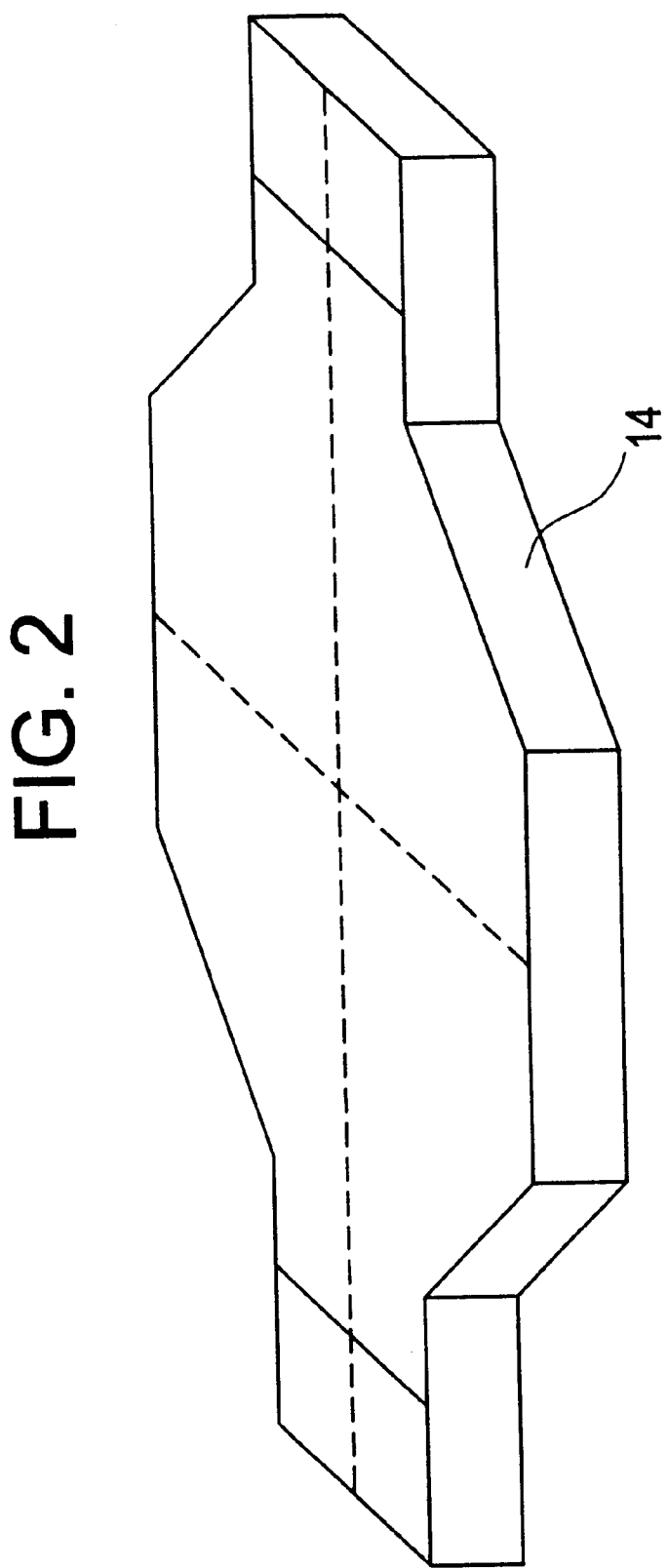
FIG. 2 depicts a yoke plate configuration.

Referring first to FIG. 1, a magnetic field generator for MRI 10 as an embodiment of this invention comprises an upper magnet unit 11 and lower magnet unit 12. Each of the magnet units 11 and 12, includes, but is not limited to, a yoke plate 14, a permanent magnet 16, and a pole piece 18. Each of the yoke plate 14 has a surface opposed to the other yoke plate, and this surface is provided with a permanent magnet 16, on which a pole piece 18 is provided. Each of the permanent magnets 16 includes a plurality of magnet blocks 20. Each of the magnet blocks 20 of the magnet unit 12 is fitted with adjacent ones, with the same magnetic pole facing upward. On the other hand, each of the magnet blocks 20 of the magnet unit 11 is fitted with adjacent ones, with the other magnetic pole facing downward. In other words, the permanent magnet 16 of the magnet unit 12 and the permanent magnet 16 of the magnet unit 11 are faced to each other so that different magnetic poles are opposed to each other.

The magnet blocks 20 may be a magnet made from a ternary system compound Nd—Fe—B composed mainly of neodynium (Nd), iron (Fe) and boron (B). Alternatively, part of Nd of the Nd—Fe—B may be replaced by dysprosium (Dy) while part of the Fe may be replaced by cobalt (Co). The Nd—Fe—B is known as a strong neodynium magnetic material with a maximum energy product of over 320 kj/m 3. It should be noted here that a method for making a rare earth magnet is disclosed in detail, for example, in the U.S. Pat. No. 4,770,723.

The pair of opposed magnet units 11 and 12, are supported and magnetically connected by one or more posts 22, with a selected space in between, for example 40 cm to 60 cm. With such a structure, the magnetic field generator 10 is configured to form a uniform magnetic field in a space between the pair of pole pieces 18.

Now, for the above magnetic field generator 10, description will be made as to a method for assembling the permanent magnet 16 by placing a plurality of magnet blocks 20 in a generally disc pattern on an upper surface of the yoke plate 14. Each of the magnet blocks 20 may include a plurality (eight, for example) of magnet members. The magnet member is made by pressing and sintering magnetic powder into a general cube. Then the plurality of magnet members are bonded with each other to form a magnet block 20 (the magnet block 20 is affixed to a glider first, then magnetized as will be described at a later point herein.

Figure 3:
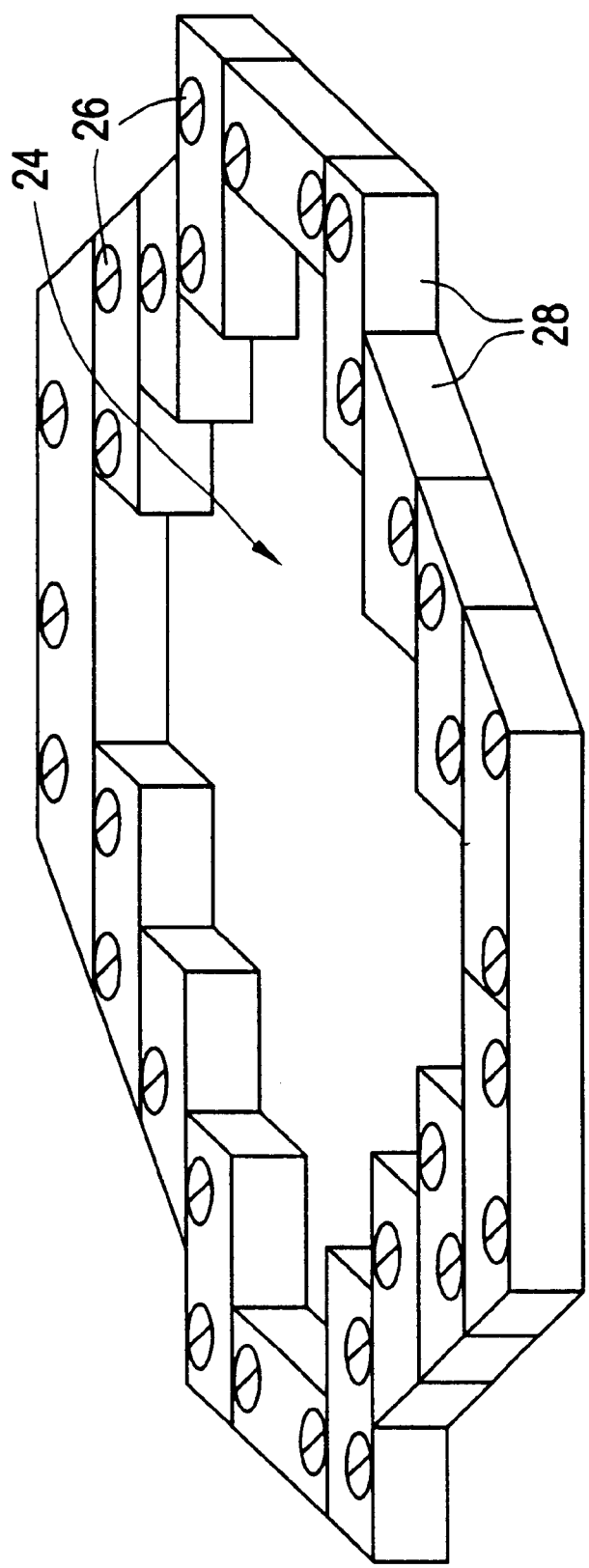
FIG. 3 depicts a diagrammatic representation of the assembled stoppers of an exemplary embodiment.

Referring to FIGS. 2–5, depicted is an exemplary layout of a yoke plate 14 of a magnet unit 11, and 12. Fastened to the yoke plate 14, on one side, is plurality of stoppers or retainers 28. The plurality of retainers 28 is affixed to the bottom the yoke plate 14 for the upper magnet unit 11 and the top for the lower magnet unit 12. In their completed layout, the plurality of retainers 28, form effectively, a perimeter substantially similar to that of the yoke plate 14 and a cavity 24, which is to be populated with the magnet blocks 20. A retainer 28 may include, but not be limited to, a block or clamp apparatus. The retainer 28 may, but need not be, constructed of a ferromagnetic material preferably, but not necessarily, the same as the yoke plate 14. Common non-magnetic materials may include but not be limited to aluminum, stainless steel, plastic G-10, and the like, as well as combinations including at least one of the foregoing. FIG. 3 provides a depiction of an exemplary arrangement for the plurality of retainers 28.

Figure 4:
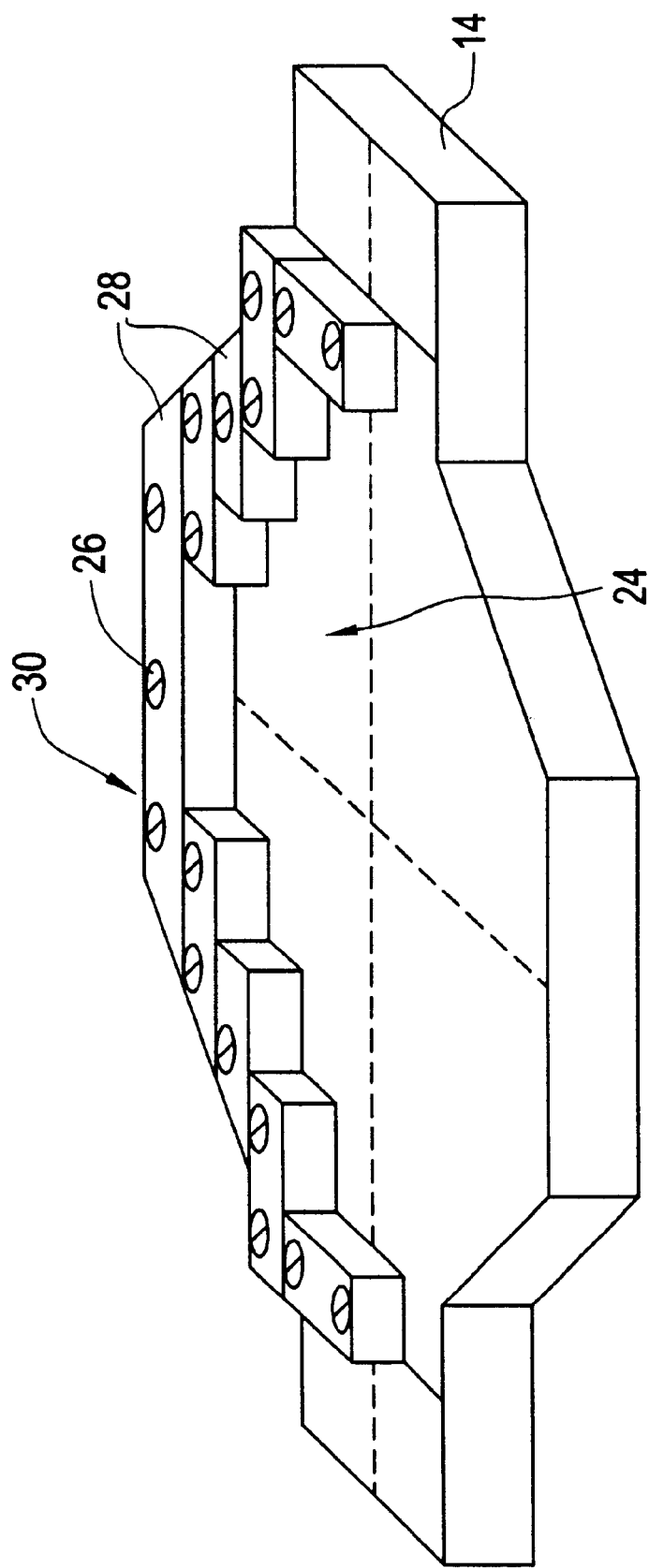
FIG. 4 depicts a diagrammatic representation of stoppers attached to the yoke plate to facilitate assembly.

Referring now to FIG. 4, a first set 30 of the plurality of retainers 28 are arranged substantially about a portion of perimeter of the yoke plate 14 of magnet unit (11 or 12) and fixed to the yoke plate 14 in a manner that facilitates assembly such as with a fastener 26, keeper, or adhesive. Each of the retainers 28 may be detachably affixed to the yoke plate 14 employing a fastener 26 such as screw, bolt, and the like. The fastener 26 may be constructed of a ferromagnetic material preferably, but not necessarily, the same as the yoke plate 14. The first set 30 of the plurality of retainers 28 are arranged and fixed to the yoke plate 14 in an approximately semicircular configuration about the perimeter of one side of the yoke plate 14. The first set 30 of the plurality of retainers 28 forming a substantially semicircular, C, U, or V-shape portion of the cavity 24, which is to be populated with the magnet blocks 20.

Figure 5:
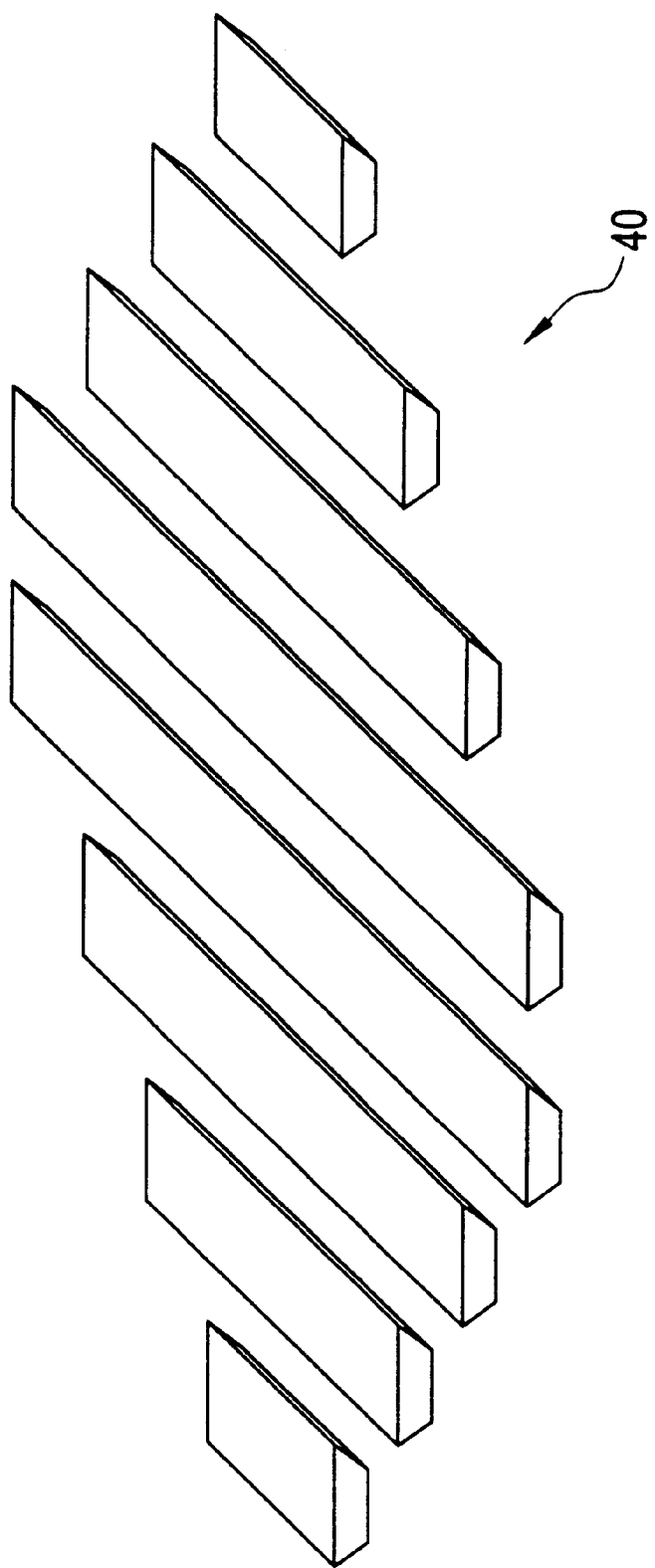
FIG. 5 depicts a diagrammatic representation of a rails set for an exemplary embodiment.
Figure 6:
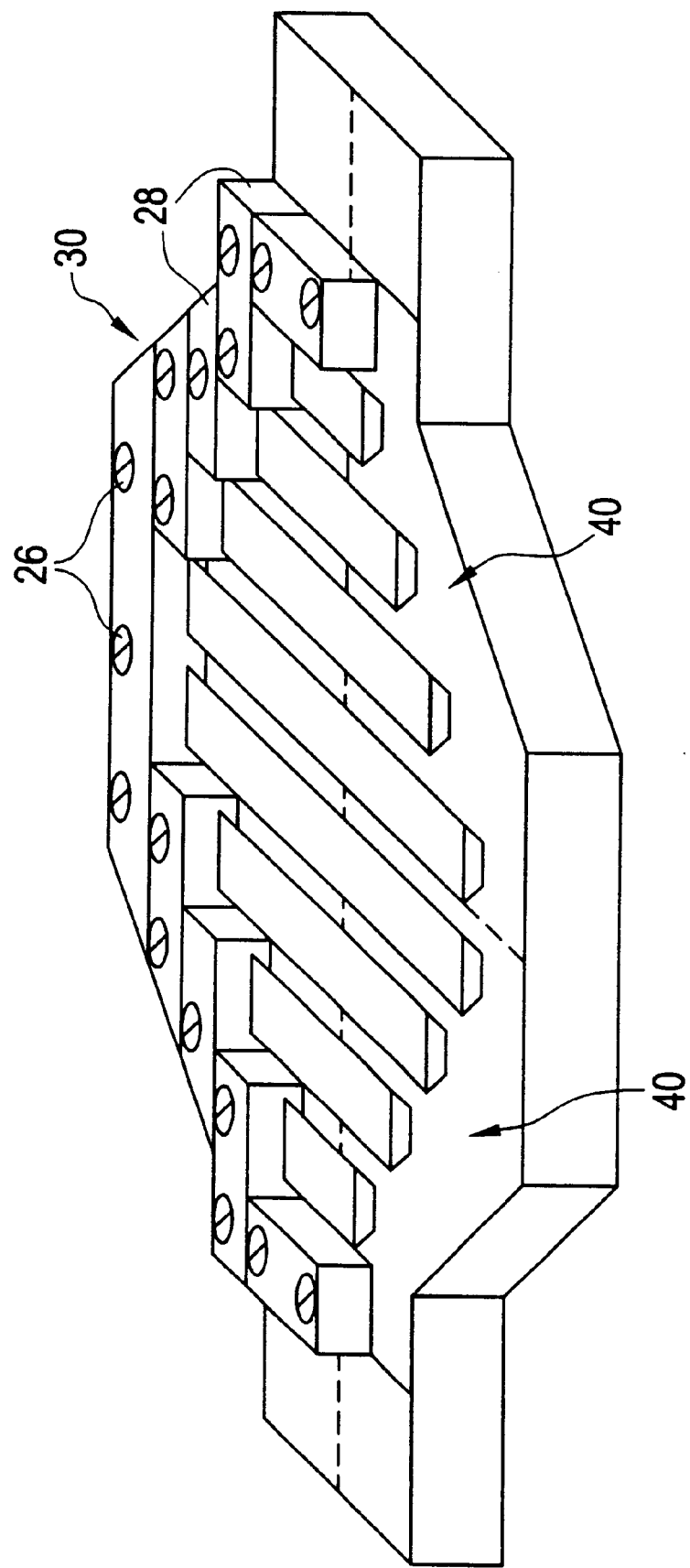
FIG. 6 depicts a diagrammatic representation of rails attached to the yoke plate surface.

Referring now to FIGS. 5 and 6, an exemplary set of rails 40 is depicted. The set of rails 40 in an exemplary embodiment comprise a series of bars exhibiting a cross section configured to facilitate magnet blocks 20 being slid along their length, yet impede motion laterally. The set of rails 40 are arranged and fixed to the yoke plate 14 in a manner that facilitates assembly such as with a fastener 26, keeper, or adhesive such as glue or epoxy. The set of rails 40 may be detachably affixed to the yoke plate 14 employing a fastener 26 such as screw, bolt, and the like. The set of rails 40 and fastener 26 (if utilized) may, but need not be, constructed of a ferromagnetic material preferably, but not necessarily, the same as the yoke plate 14. In the figure, the set of rails 40 are depicted to be substantially bars of substantially trapezoidal cross section with, in this instance the shorter base of the trapezoidal cross section proximate to the yoke plate 14 and the larger base of the trapezoidal cross section of the set of rails 40 directed away from the yoke plate. The set of rails 40 are arranged in the cavity 24 formed by the retainers 28 on the yoke plate 14 extending substantially parallel to the opening of the semicircular, C, U, or V-shape portion of the cavity 24. The set of rails 40 are arranged substantially parallel to one another, with various lengths extending substantially side to side within the cavity 24 formed by the retainers 28. Additionally, each of the rails the set of rails 40 are spaced substantially equidistant from one another. FIG.6 depicts the yoke plate 14 with the first set of retainers 28 and rails 40 in the cavity 24 formed therefrom.

Figure 7:
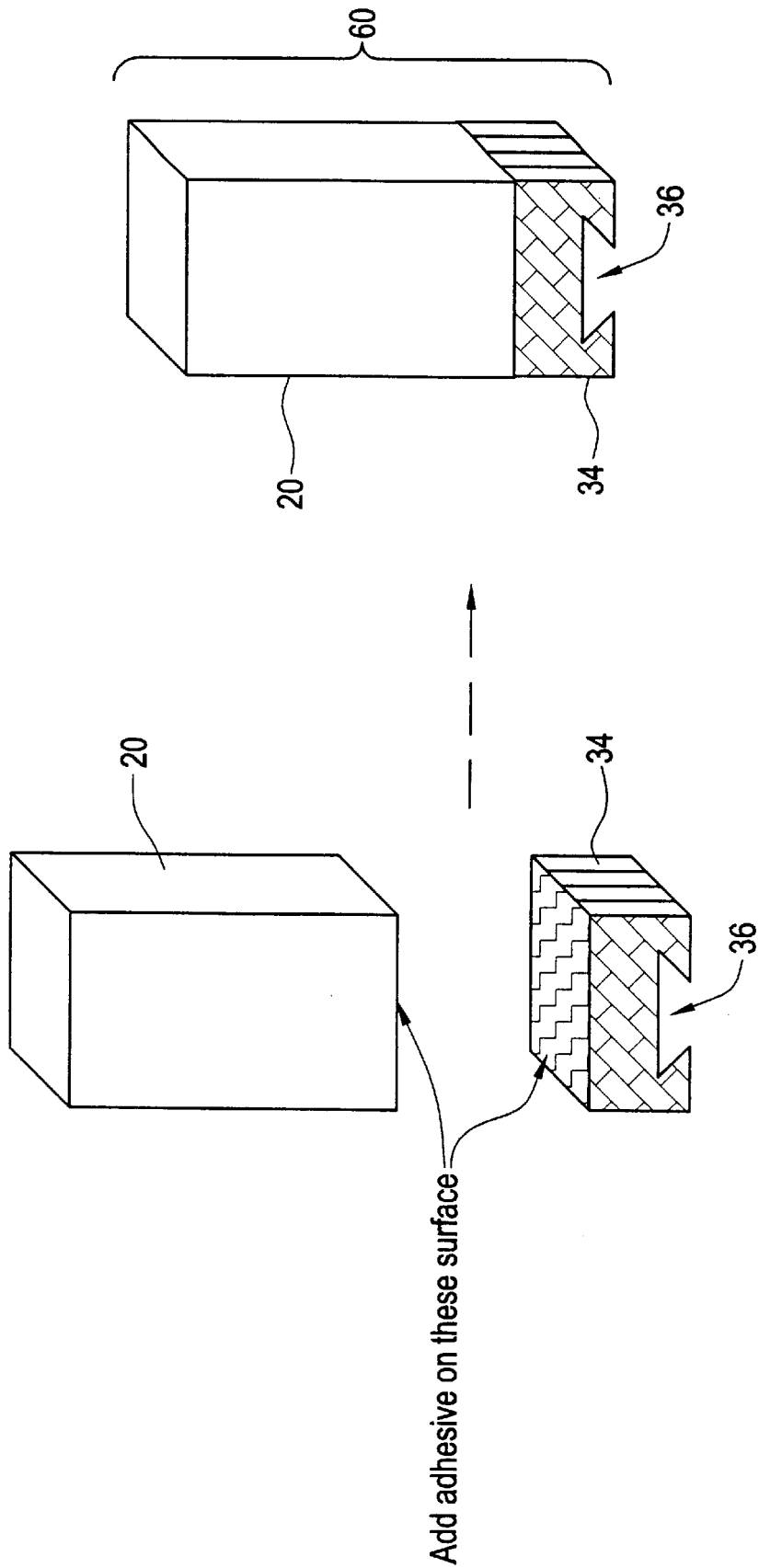
FIG. 7 depicts a diagrammatic representation if attaching un-magnetized permanent magnet block to the glider, and then magnetizing them as an assembly.
Figure 16:
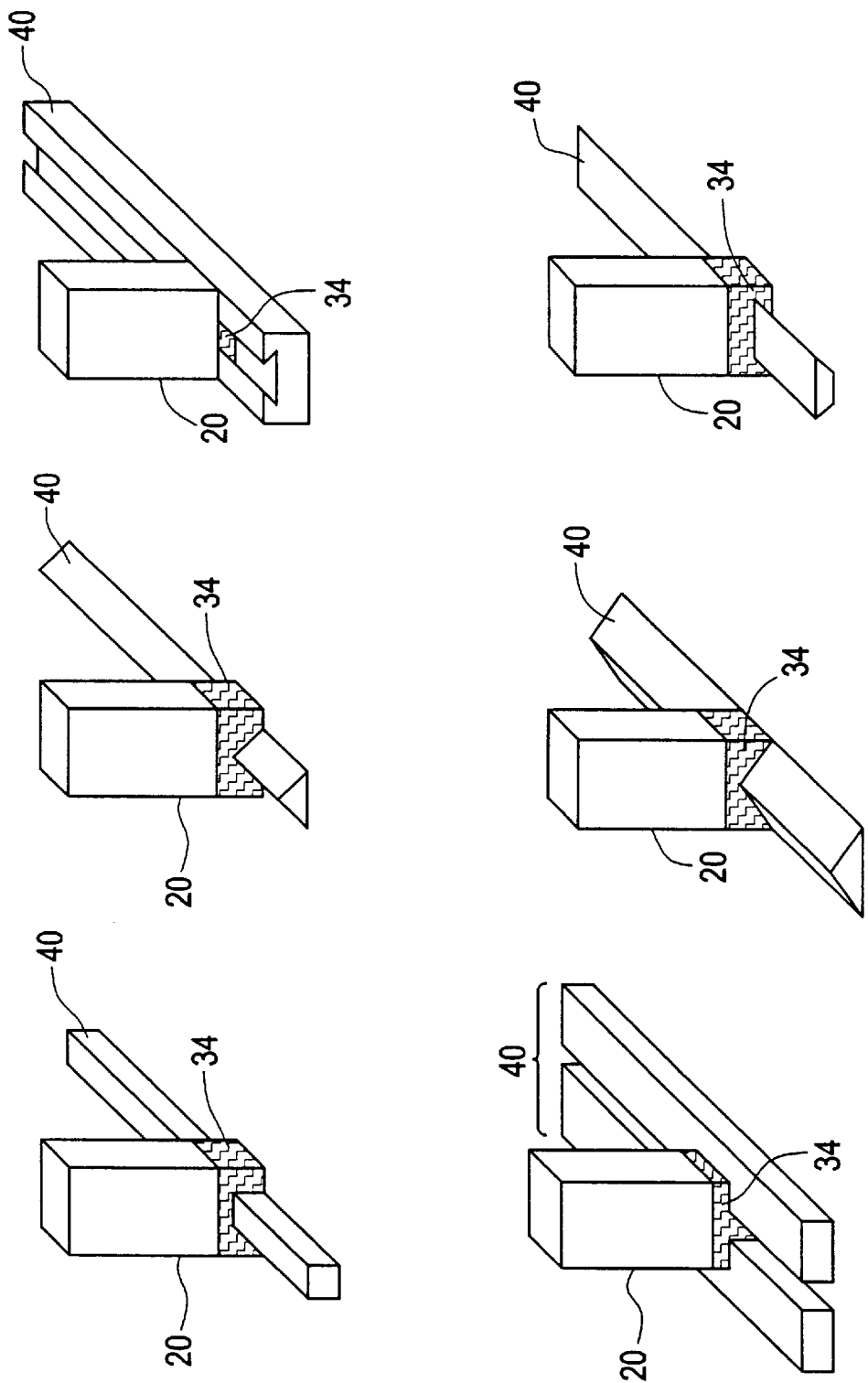
FIG. 16 depicts a diagrammatic representation of multiple configurations for the rail and glider configuration of an exemplary embodiment.

Turning now to FIG. 7, attention may now be directed to the magnets blocks 20 and gliders 34. In an exemplary embodiment, the gliders 34 comprise a block of substantially the same footprint as the magnet blocks 20. The glider 34, like the other elements of the assembly, may be constructed of a ferromagnetic material, preferably, but not necessarily, the same as the yoke plate 14. The glider 34 includes a slot 36 on side nearest the yoke plate 14 of matched geometry and configured to mate with the shape of the rails 40. For example, as depicted in FIG. 7, the rails 40 have a substantially trapezoidal cross section and the slot 36 in the glider 34 is substantially of trapezoidal cross section. It will be appreciated that numerous variations for rail 40 and glider combinations may be conceived. For example, FIG. 16 depicts a few exemplary configurations of rails 40 and gliders 34.

The magnet blocks 20, while un-magnetized are affixed to the side opposite the slot 36 of the gliders 34. In an exemplary embodiment, to facilitate assembly, the magnet blocks 20 are affixed to the gliders 34 with adhesive, for example glue or epoxy. It should be appreciated however, that numerous variations for attaching the magnet block 20 to the glider 34 are possible. Advantageously, once the magnet blocks 20 are affixed to the gliders 34, they may be magnetized as an assembly, thereby forming a block assembly 60 in preparation for assembly of the magnet units 11 and 12. Another advantage of configuring the magnet block 20 and glider 34 as described above, is that it yields a single or common block assembly 60 for all the magnet blocks 20, gliders 34, and the entirety of the magnet units 11 and 12.

Figure 8:
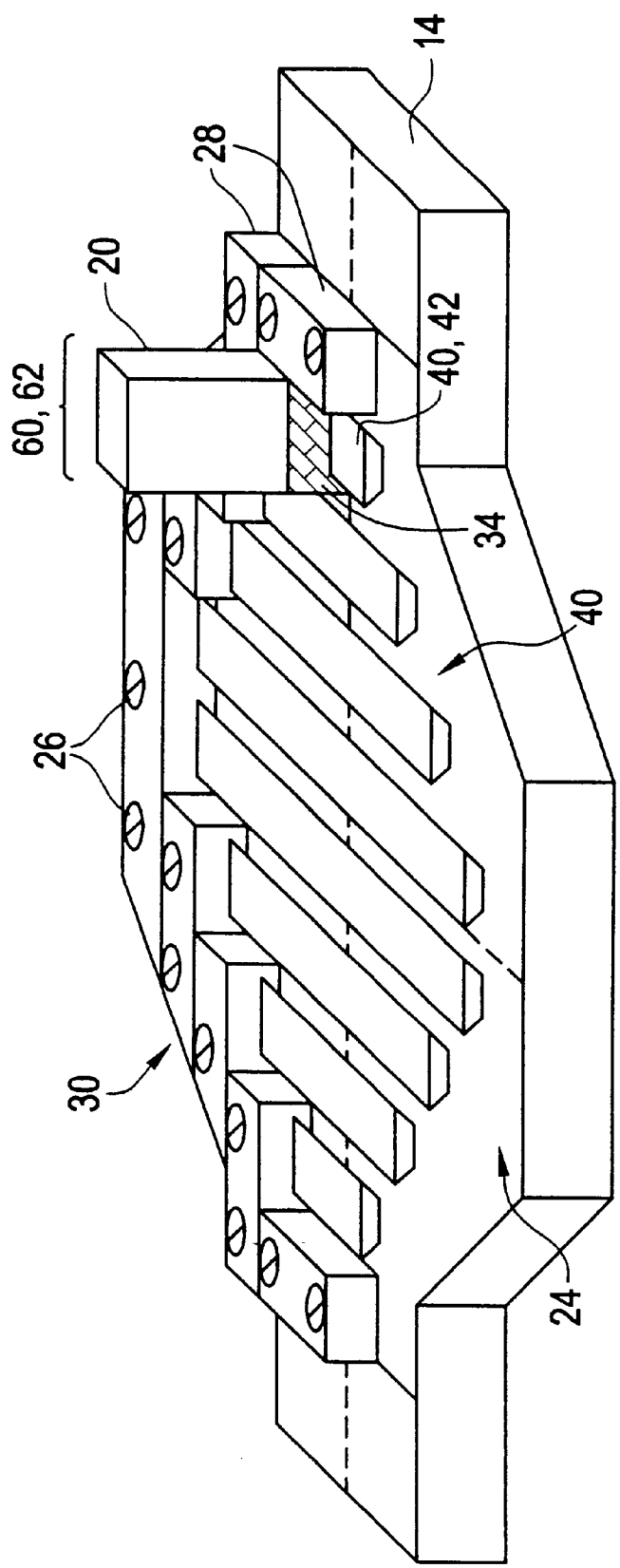
FIG. 8 depicts a diagrammatic representation of an assembly process of an exemplary embodiment for a first magnet block onto the yoke plate.
Figure 9:
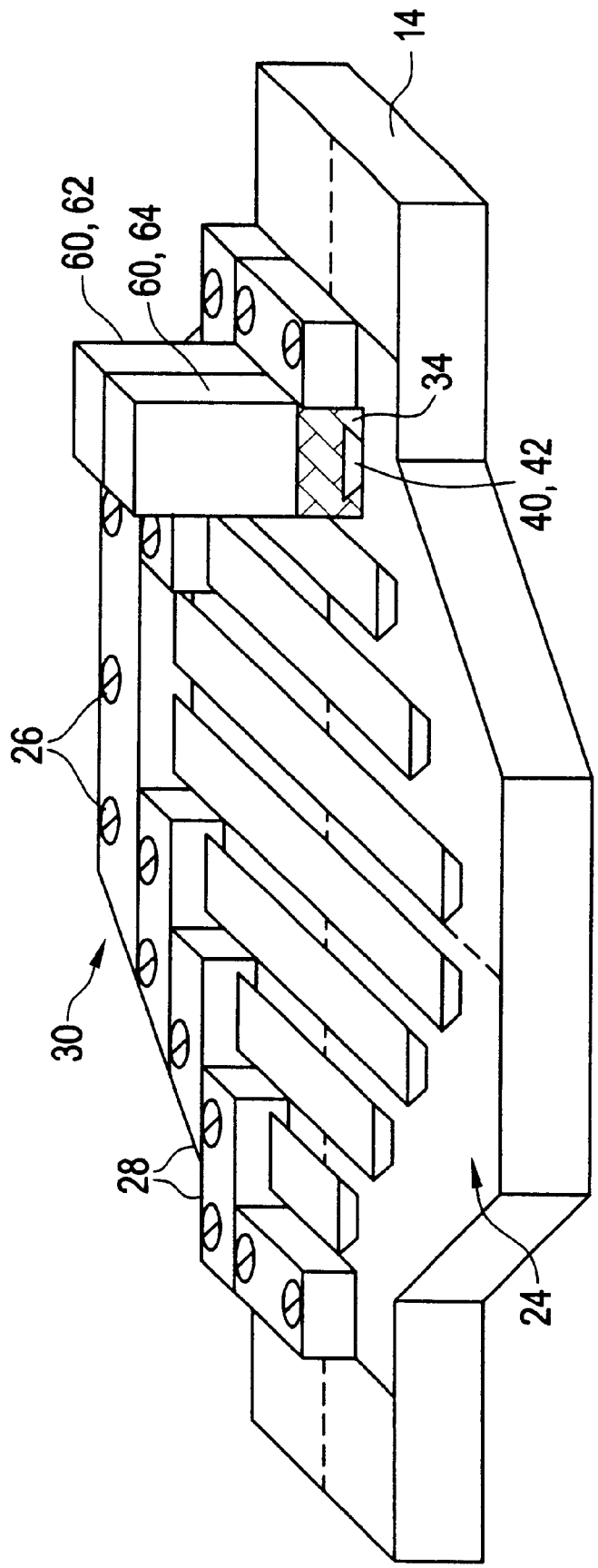
FIG. 9 depicts a diagrammatic representation of an assembly process of an exemplary embodiment for a second magnet block onto the yoke plate.
Figure 10:
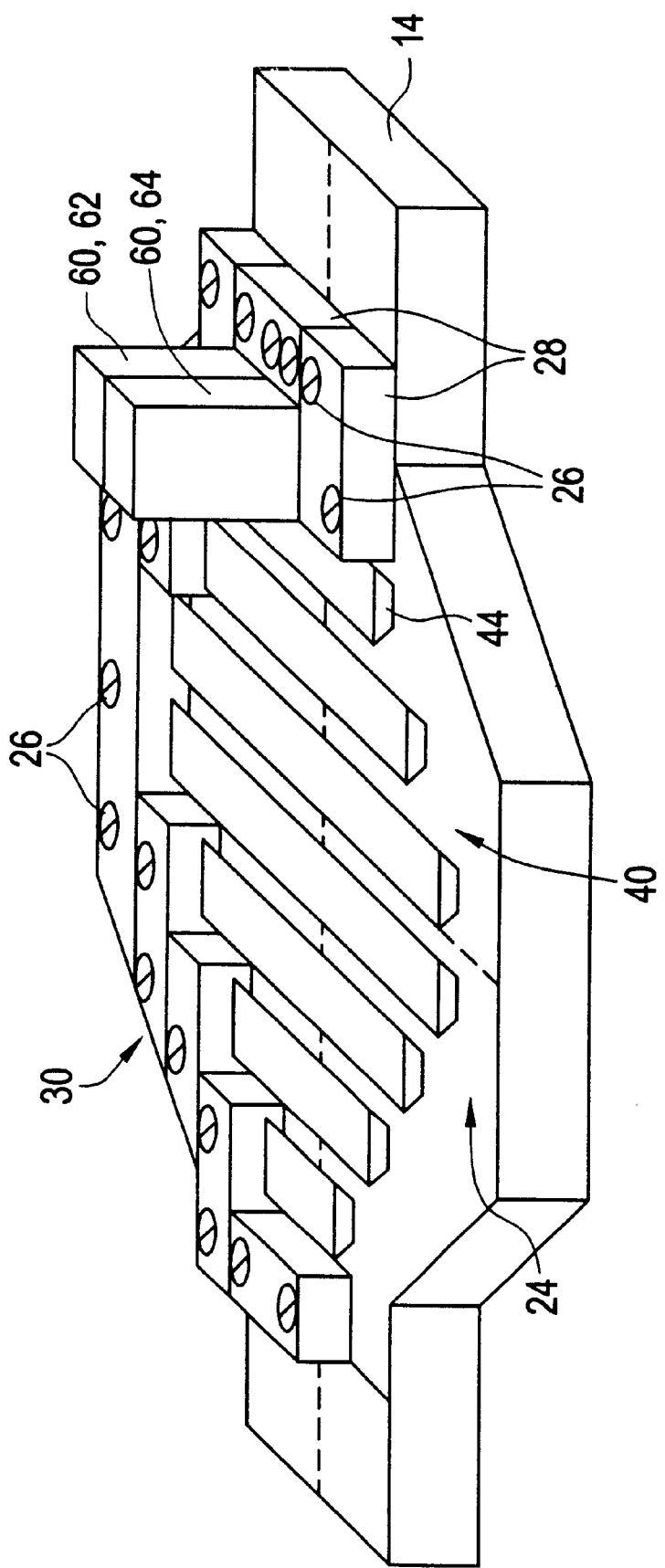
FIG. 10 depicts a diagrammatic representation of adding a first finishing stopper for the first row of magnet blocks.

Turning now to FIG. 8, a diagram depicting the assembly of the permanent magnet 16 for each of the magnet units 11 and 12 is provided. A first block assembly 62 may now be slid along a first rail 42 substantially until the first block assembly encounters the retainer 28 at the distal end of the first rail 42. Thereafter, as depicted in FIG. 9, a second block assembly 64 (and subsequent block assemblies, if required) may be slid along the first rail 42 until the area provided by the first rail 42 as a first portion of the cavity 24 is filled with block assemblies 60 to completion. The completed first row 71 of block assemblies 60 along the length of the first rail 42. Turning to FIG. 10, a retainer 28 is installed to contain and hold the first block assembly 62 and second block assembly 64 (and subsequent block assemblies if any).

Figure 11:
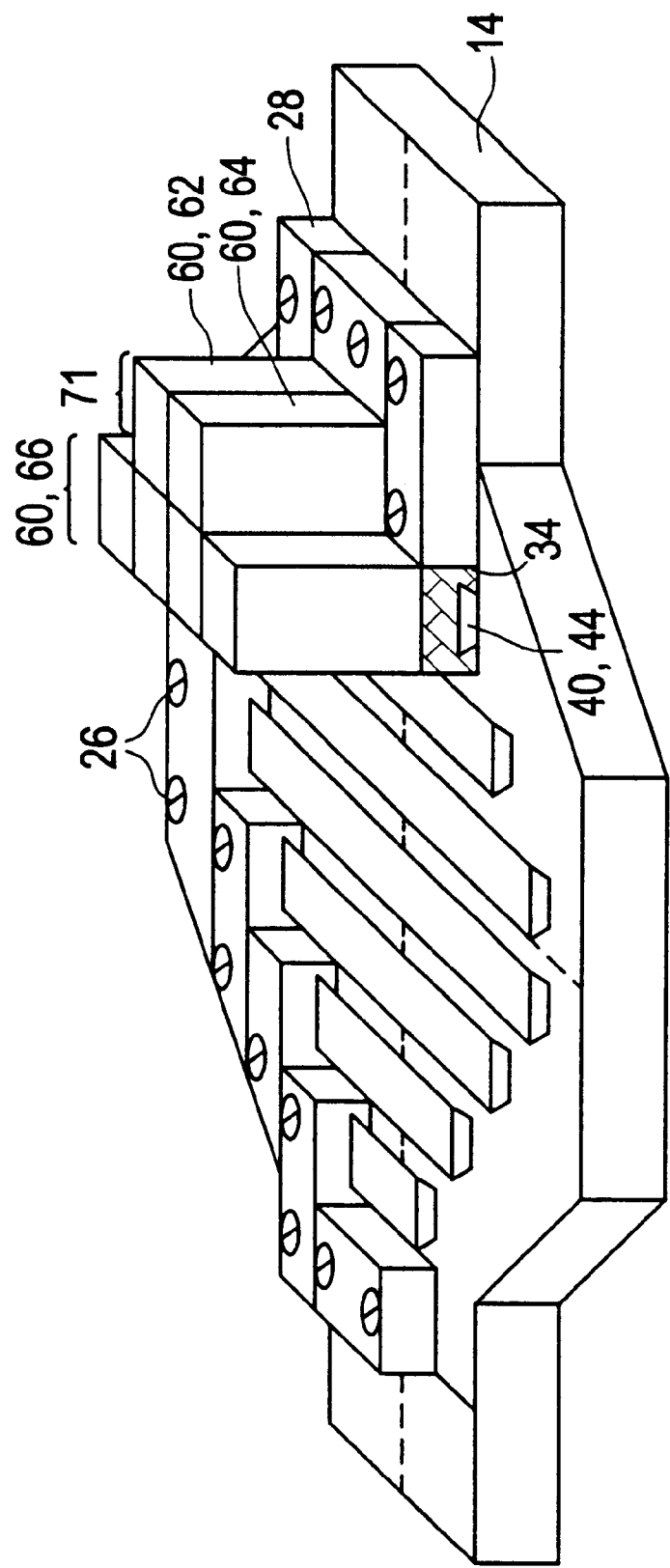
FIG. 11 depicts a diagrammatic representation of assembling a second row of magnet blocks.
Figure 12:
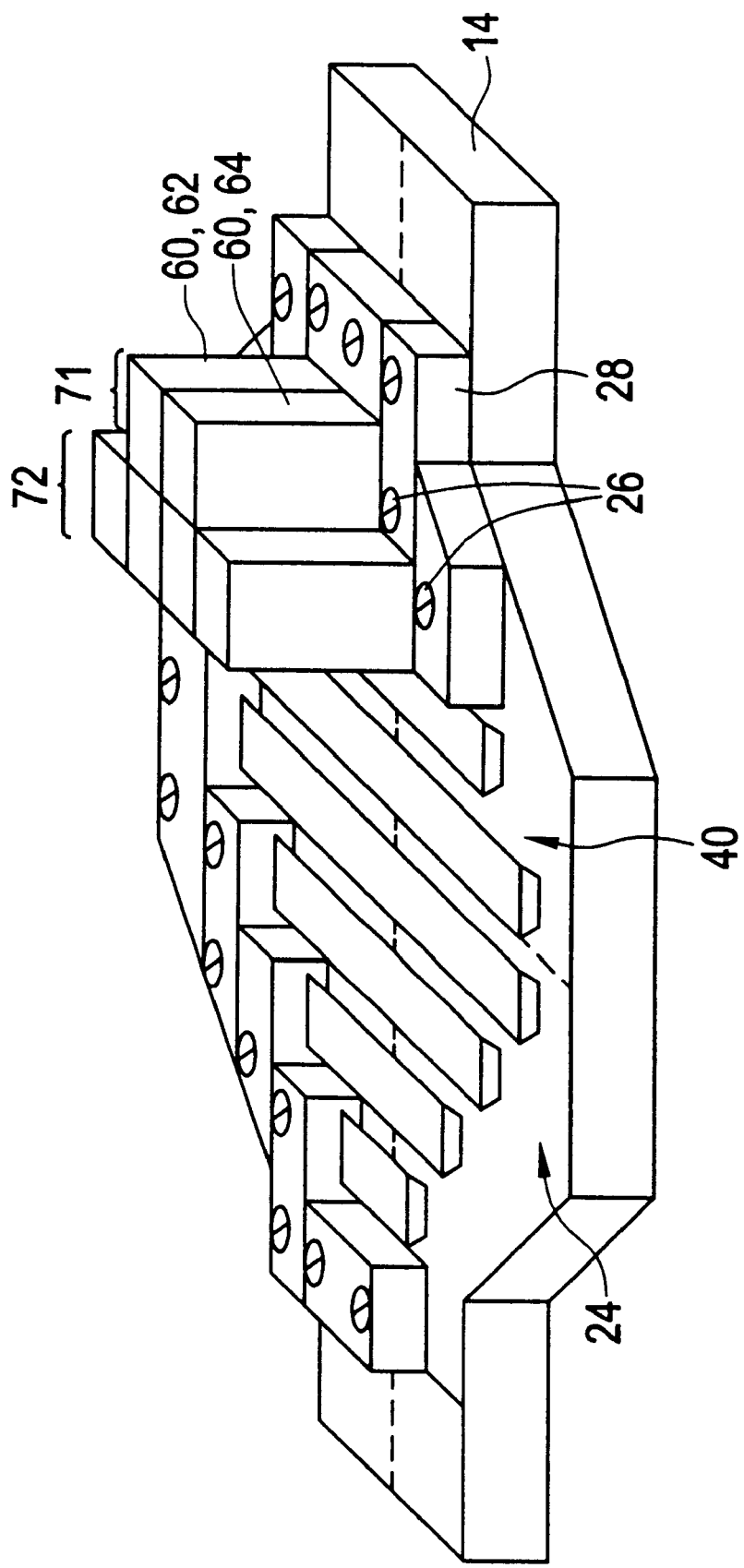
FIG. 12 depicts a diagrammatic representation of adding a finishing stopper for a 2nd row of magnet blocks.

Turning now to FIG. 11, a diagram depicting the continued assembly of the permanent magnet 16 is provided. A third block assembly 66 may now be slid along a second rail 44 substantially until the third block assembly encounters the retainer 28 at the distal end of the second rail 44. Thereafter, a fourth block assembly 68 (and subsequent block assemblies, if required) may be slid along the second rail 44 until the area provided by the second rail 44 as a second portion of the cavity 24 is filled with block assemblies 60 to completion. The completed second row 72 of block assemblies 60 along the length of the second rail 44 as depicted in the figure. Turning to FIG. 12, a retainer 28 is thereafter installed to contain and hold the block assemblies 60 (e.g. block assemblies 66 and subsequent block assemblies) installed on the second rail 44. Once again, the retainer 28 may be installed and attached with a fastener 26 such as a screw or bolt.

Figure 13:
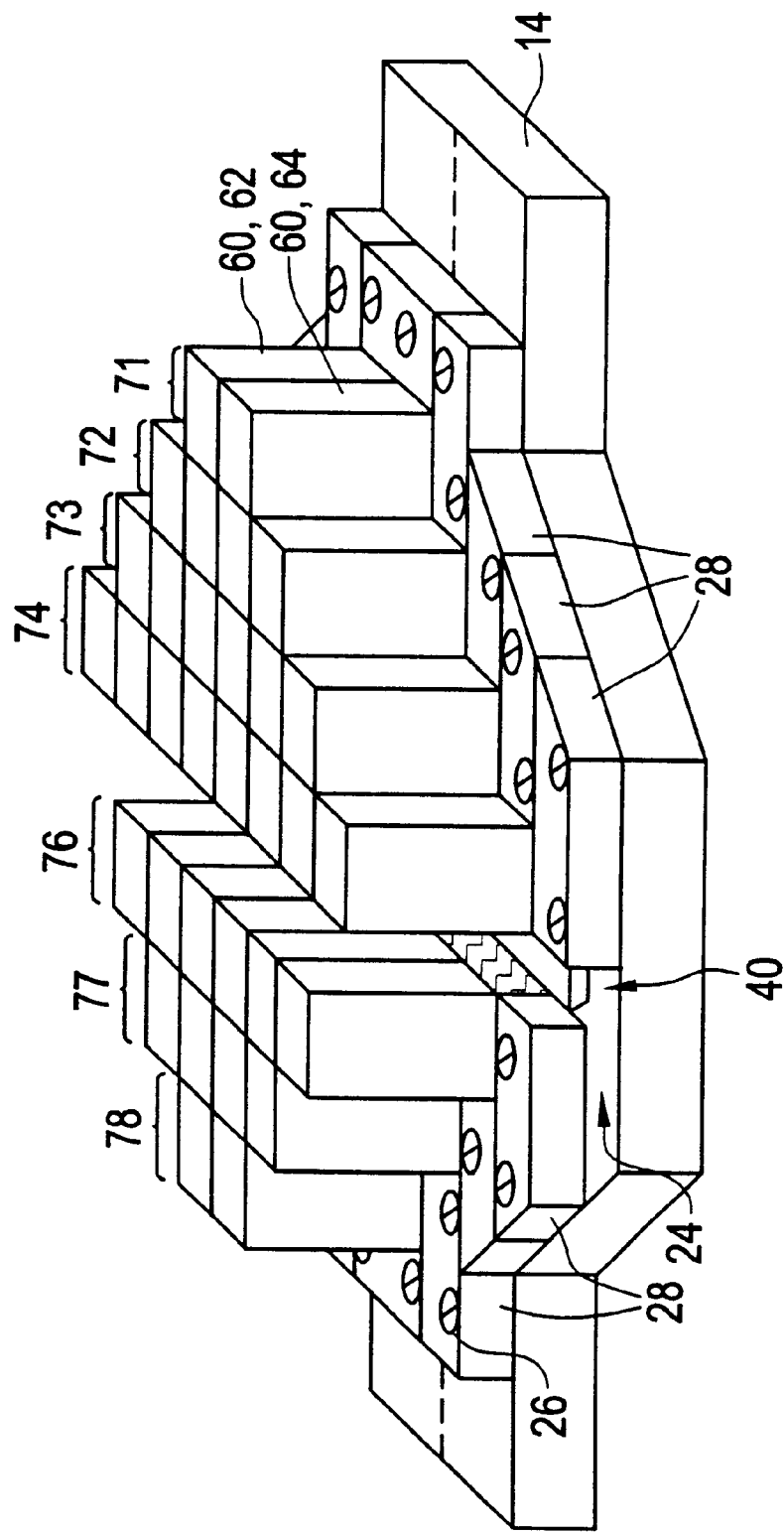
FIG. 13 depicts a diagrammatic representation of a partial assembly before introducing the last row of magnet blocks.

Turning now to FIG. 13, a diagram depicting the nearly completed assembly of the permanent magnet 16 is provided. As depicted in the figure, a third and fourth row of block assemblies 74 and 76 respectively, have been completed and secured with retainers 28. Additionally, the figure depicts the assembled and secured eighth, seventh, and sixth rows, 78, 77, and 76 respectively. It should be noted at this time, that it should be evident from the figures that the retainers 28 may overlap more than one rail 40 and therefore more than one row e.g., 71–78 from the outermost to the innermost. Therefore, to facilitate assembly and installation, filling the rails 40 with the components is most easily accomplished by starting with the outermost rails 40 and moving toward the center. It should be appreciated that disclosed herein is just an illustrative assembly sequence. Other sequences are possible, and likely, depending upon the selected orientation for the rails 40 and retainers 28 on the yoke plate 14.

Figure 14:
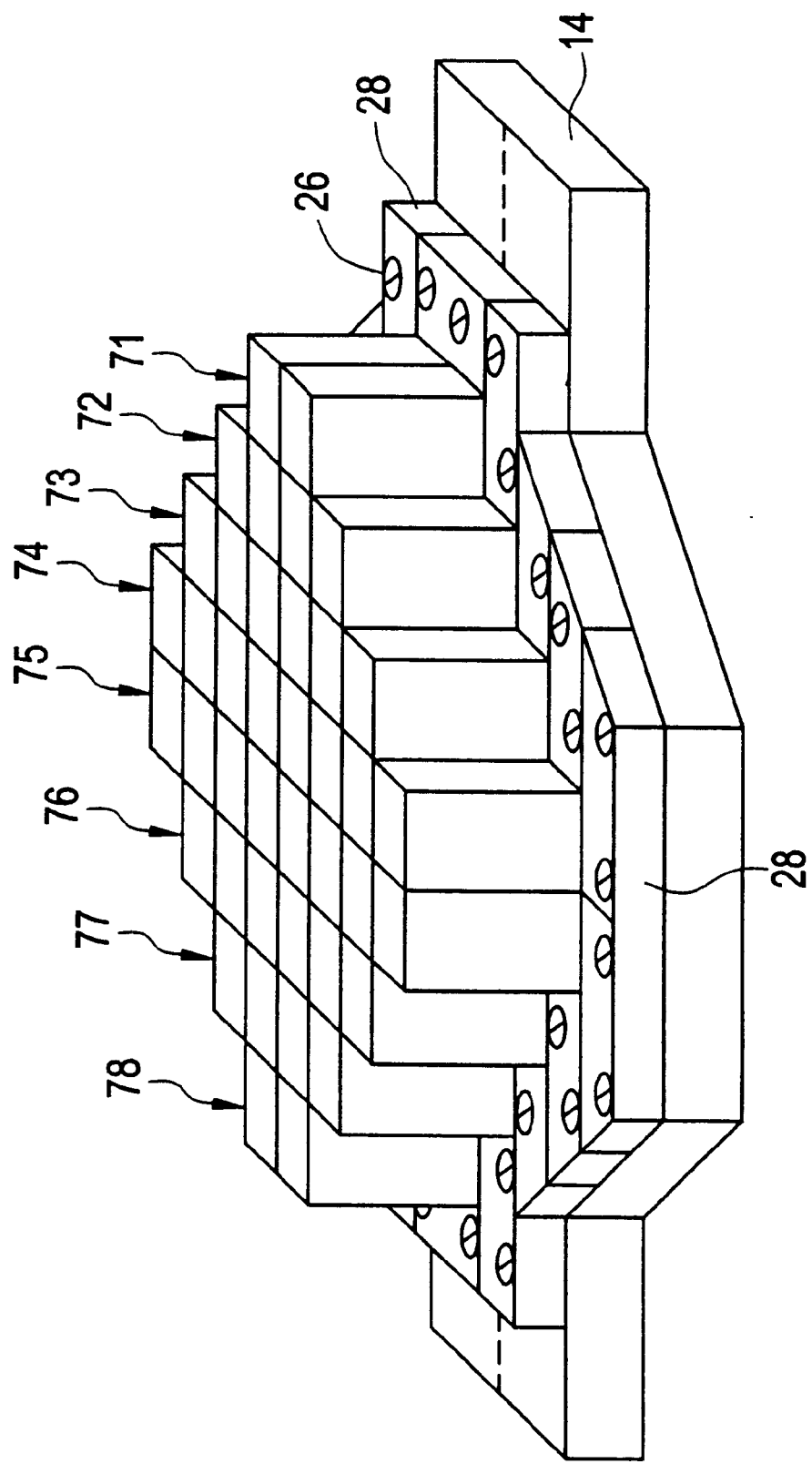
FIG. 14 depicts a diagrammatic representation of a final assembly of magnet blocks installed on a yoke plate.
Figure 15:
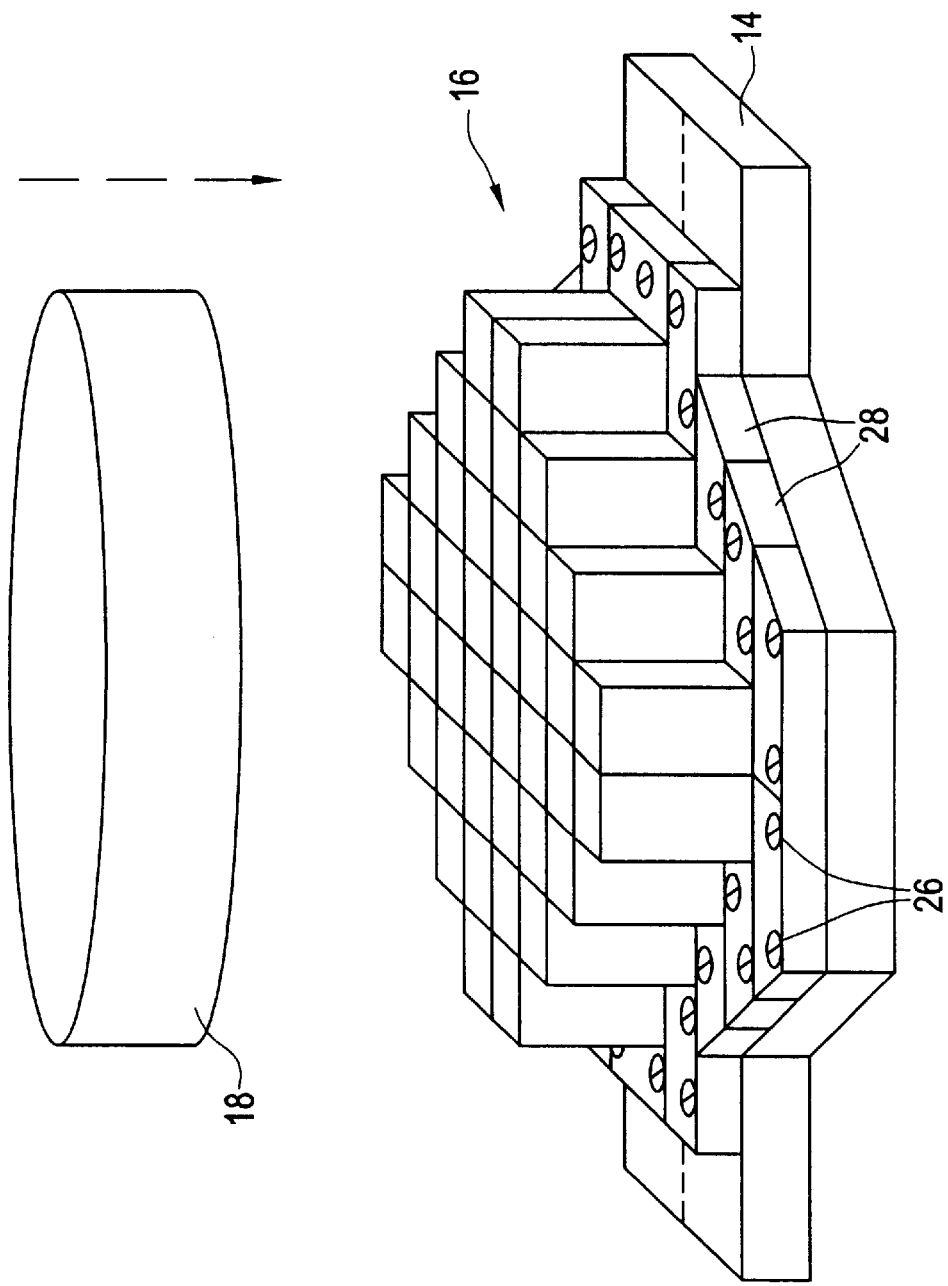
FIG. 15 depicts a diagrammatic representation of installation of a pole piece to the final assembly.

Returning to FIG. 13, additional block assemblies may now be added to fill the remaining rail 40 and complete the fifth row 75 as the final row to be populated. FIG. 14 depicts a permanent magnet 16, fully populated with block assemblies 60 and secured with retainers 28. Referring to FIG. 15, to complete the assembly of the magnet units 11 and 12, the top and bottom pole pieces 18 may be engaged and secured to the permanent magnet 16. It should be noted at this time, that the pole piece 18 assembly may be at a positioned as described in U.S. Pat. No. 6,336,989 or any position during the entire magnet block assembly 60 insertion process. While the pole piece 18 plays an important role to an easy assembly process, it is not necessarily needed to arrange the pole piece the same way in this disclosure.

Figure 17:
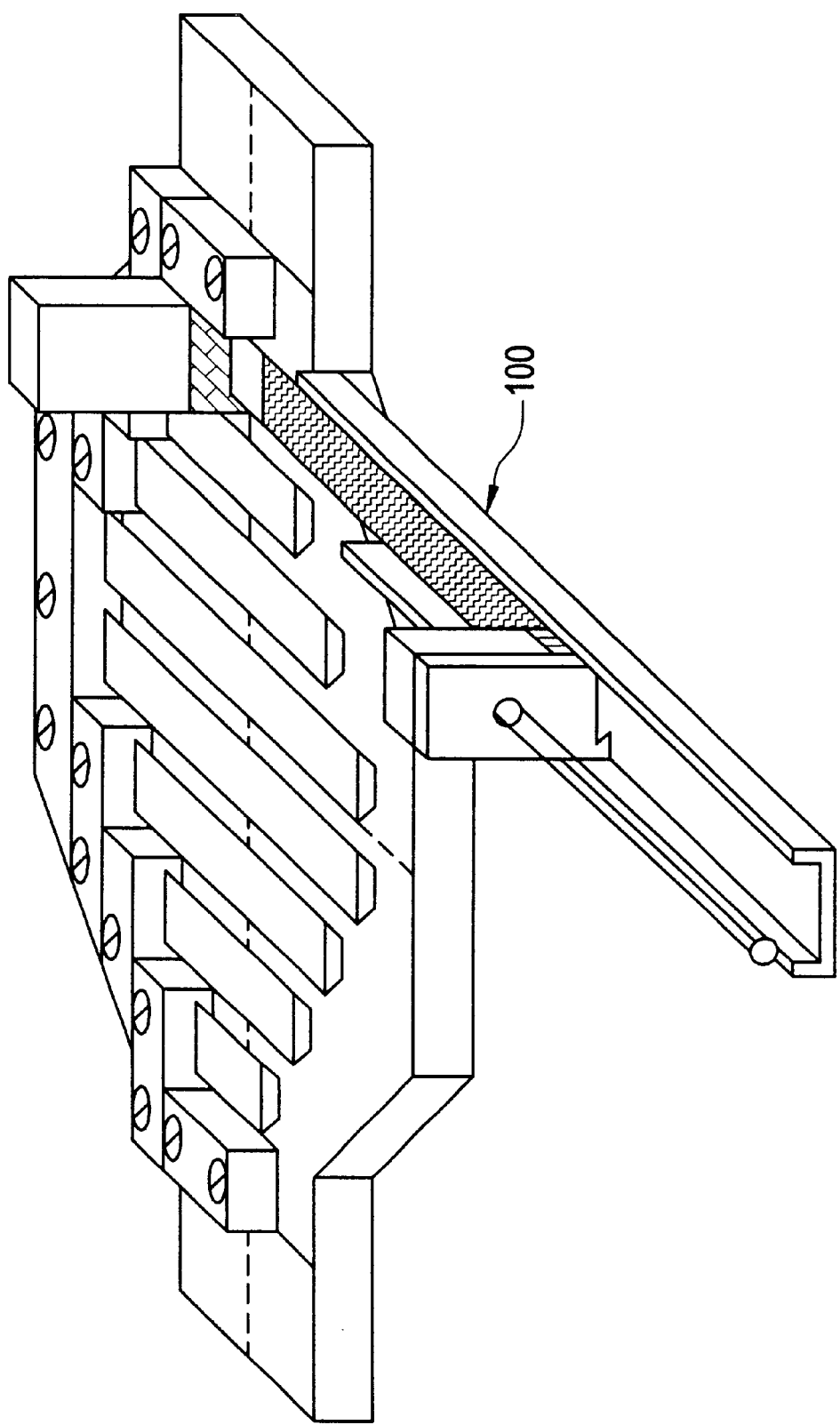
FIG. 17 depicts an exemplary apparatus for insertion of the block assemblies 60.

Turning now to FIG. 17, an exemplary apparatus for insertion of the block assemblies 60 is depicted. Shown in the figure is a magnet block pusher tool 100 configured so that it may be aligned with each of the magnet units 11 and 12 in a manner that facilitates sliding individual block assemblies 60 onto a selected rail 40. In an exemplary embodiment, magnetized block assemblies 60 are placed on a magnet block pusher 100 for insertion. It will be appreciated that the block assemblies 60 may be configured to readily slid along the rail 40 as part of the assembly and yet fit tightly enough to ensure desirable tolerances for the assembled array of block assemblies of the permanent magnet 16 for each magnet unit 11, 12. The assembly process is therefore relatively easy and conventional. The magnet blocks 20/block assemblies 60, rails 40, and retainers 28, and other components may be located as accurately as needed with the block assemblies constrained by the rails 40, gliders 34, and retainers 28, to maintain the desired assembly tolerances for the magnet units 11 and 12. It will be appreciated further that while the layout of the rails in cooperation with the gliders is in illustration a function of a selected footprint for a magnet block 20, other configurations are readily apparent. The layout could employ a variety of configurations to satisfy the considerations necessary to construct the permanent magnet 16.

Advantageously, because each of the block assemblies 60 is secured by its physical constraints and the rails 40, gliders 34, and retainers 28 in the assembly process, no adhesives or bonding is required between the individual block assemblies. This advantage significantly enhances the assembly process as well as facilitates modification, disassembly, system upgrade, rework, or recycle of the magnet members in the future. Other embodiments may be employed perhaps utilizing larger tolerances in the assembly and employing adhesives or epoxies as required to retain the assembly.

This feature of an exemplary embodiment eliminating the need for adhesives provides significant advantages in that it facilitates rework of the magnet assembly should it be necessitated. In case of the need for modification, repair, rework, or disassembly, the above disclosed assembly process may be substantially reversed to facilitate the disassembly process since there are no bonding agents or adhesives employed among the magnet members. In other words, should a damaged magnet block 20/block assembly 60 require removal, because no adhesives are employed between the magnet blocks 20/block assemblies 60 or between the magnet blocks 20/block assemblies 60 and the rails 40 or yoke plate 14, the assembly process may be essentially reversed. The damaged magnet block 20/block assembly 60 may readily be removed, and replaced with a new one (e.g., raise the pole piece 18, remove a retainer 28, remove magnet blocks 60, and so forth).

It will be appreciated that in the above disclosure, numerous examples were provided where an element of the magnet assembly; block retainer 28, fastener 26, rail 40, glider 34 and the like are described as being potentially constructed of a ferromagnetic material preferably, but not necessarily, the same as the yoke plate 14. There may be instances where non-magnetic construction is beneficial. For example, if non-magnetic material is used, it may be easy to install certain components since there will be no magnetic force interacting upon them. Such a configuration may require the utilization of additional magnet blocks 20 to account for the difference in magnetic materials. Common non-magnetic materials may include but not be limited to aluminum, stainless steel, plastic G-10, and the like, as well as combinations including at least one of the foregoing.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for assembling a magnetic field generator for a magnetic resonance imaging system, the method comprising:

establishing an arrangement for a permanent magnet of a magnet assembly comprising a ferromagnetic yoke plate and a permanent magnet, wherein said arrangement includes a portion of a cavity formed from placement of a portion of a plurality of retainers attached at substantially a perimeter of said yoke plate;

populating said first portion of said cavity with a set of rails attached to said yoke plate;

affixing a plurality of gliders to a plurality of magnet blocks and magnetizing said gliders and magnet blocks to form a plurality of block assemblies;

sliding each block assembly of said plurality of block assemblies along a rail of said set of rails; initiating with an outermost rail and concluding with an innermost, securing each successively filled rail with a retainer.

2. The method of claim 1 further including attaching a pole piece to said permanent magnet.

3. The method of claim 1 wherein said first portion of said cavity is substantially semicircular.

4. The method of claim 1 wherein each rail of said set of rails is oriented substantially parallel extending substantially parallel to an open end of said first portion of said cavity.

5. The method of claim 1 wherein said set of rails are arranged substantially parallel to one another, with various lengths extending substantially side to side within said cavity formed by said retainers.

6. The method of claim 1 wherein each rail of said set of rails is spaced substantially equidistant from one another.

7. The method of claim 1 wherein said set of rails each exhibit a cross section configured to facilitate said block assemblies being slid along their length, yet impede motion laterally to said rails.

8. The method of claim 1 wherein each glider of said plurality of gliders includes a slot of matched geometry and configured to mate with a rail of said set of rails.

9. The method of claim 8 wherein said slot is substantially of trapezoidal cross section and each rail of said set of rails is a bar of substantially trapezoidal cross section, with a shorter base of said trapezoidal cross section proximate to said yoke plate and a larger base of said trapezoidal cross section directed away from said yoke plate.

10. The method of claim 1 wherein each glider of said plurality of gliders comprises a block of a substantially similar footprint as a magnet block of said plurality of magnet blocks.

11. The method of claim 1 said sliding further includes a magnet block pusher tool configured to facilitate said pushing said block assembly along a selected rail of said set of rails.

12. The method of claim 1 wherein at least one of said retainers, said rails, and said gliders are ferromagnetic.

13. The method of claim 1 wherein said sliding includes securing said each block assembly employing at least one of; frictional engagement between said block assembly and at least one of another block assembly and said block retainer, and an adhesive.

14. A magnetic field generator for a magnetic resonance imaging system comprising:
an arrangement for a permanent magnet of a magnet assembly comprising a ferromagnetic yoke plate and a permanent magnet, wherein said arrangement includes a portion of a cavity formed from placement of a portion of a plurality of retainers attached at substantially a perimeter of said yoke plate;
said first portion of said cavity populated with a set of rails attached to said yoke plate;
a plurality of gliders affixed to a plurality of magnet blocks and magnetized to form a plurality of block assemblies;
wherein each block assembly of said plurality of block assemblies is slid along a rail of said set of rails; initiating with an outermost rail and concluding with an innermost, securing each successively filled rail with a retainer.

15. The magnetic field generator of claim 14 further including a pole piece to attached to said permanent magnet.

16. The magnetic field generator of claim 14 wherein said first portion of said cavity is substantially semicircular.

17. The magnetic field generator of claim 14 wherein each rail of said set of rails is oriented substantially parallel extending substantially parallel to an open end of said first portion of said cavity.

18. The magnetic field generator of claim 14 wherein said set of rails are arranged substantially parallel to one another, with various lengths extending substantially side to side within said cavity formed by said retainers.

19. The magnetic field generator of claim 14 wherein each rail of said set of rails is spaced substantially equidistant from one another.

20. The magnetic field generator of claim 14 wherein said set of rails each exhibit a cross section configured to facilitate said block assemblies being slid along their length, yet impede motion laterally to said rails.

21. The magnetic field generator of claim 14 wherein each glider of said plurality of gliders includes a slot of matched geometry and configured to mate with a rail of said set of rails.

22. The magnetic field generator of claim 21 wherein said slot is substantially of trapezoidal cross section and each rail of said set of rails is a bar of substantially trapezoidal cross section. with a shorter base of said trapezoidal cross section proximate to said yoke plate and a larger base of said trapezoidal cross section directed away from said yoke plate.

23. The magnetic field generator of claim 14 wherein each glider of said plurality of gliders comprises a block of a substantially similar footprint as a magnet block of said plurality of magnet blocks.

24. The magnetic field generator of claim 14 further including a magnet block pusher tool configured to facilitate pushing said block assembly along a selected rail of said set of rails.

25. The magnetic field generator of claim 14 wherein at least one of said retainers, said rails, and said gliders are ferromagnetic.

26. The magnetic field generator of claim 14 wherein each block assembly is secured employing at least one of; frictional engagement between said block assembly and at least one of another block assembly and said block retainer, and an adhesive.

27. A method for assembling a magnetic field generator for a magnetic resonance imaging system, the method comprising:
establishing an arrangement for a permanent magnet of a magnet assembly comprising a ferromagnetic yoke plate and a permanent magnet, wherein said arrangement includes a portion of a cavity formed from placement of a portion of a plurality of retainers attached at substantially a perimeter of said yoke plate;
populating said first portion of said cavity with a set of rails attached to said yoke plate;
affixing a plurality of gliders to a plurality of magnet blocks and magnetizing said gliders and magnet blocks to form a plurality of block assemblies; sliding each block assembly of said plurality of block assemblies along a rail of said set of rails; initiating with an outermost rail and concluding with an innermost, securing each successively filled rail with a retainer and securing said each block assembly employing at least one of; frictional engagement between said block assembly and at least one of another block assembly and said block retainer, and an adhesive.

28. A magnetic field generator for a magnetic resonance imaging system comprising:
an arrangement for a permanent magnet of a magnet assembly comprising a ferromagnetic yoke plate and a permanent magnet, wherein said arrangement includes a portion of a cavity formed from placement of a portion of a plurality of retainers attached at substantially the perimeter of said yoke plate;
said first portion of said cavity populated with a set of rails attached to said yoke plate;
a plurality of gliders affixed to a plurality of magnet blocks and magnetized to form a plurality of block assemblies;
wherein each block assembly of said plurality of block assemblies is slid along a rail of said set of rails; initiating with an outermost rail and concluding with an innermost, securing each successively filled rail with a retainer; and
wherein each block assembly is secured employing at least one of; frictional engagement between said block assembly and at least one of another block assembly and said block retainer, and an adhesive.

29. A magnetic field generator for a magnetic resonance imaging system comprising:

means for establishing an arrangement for a permanent magnet of a magnet assembly comprising a ferromagnetic yoke plate and a permanent magnet, wherein said arrangement includes a portion of a cavity formed from placement of a portion of a plurality of retainers attached at substantially a perimeter of said yoke plate;

means for populating said first portion of said cavity with a set of rails attached to said yoke plate;

means for affixing a plurality of gliders to a plurality of magnet blocks and magnetizing said gliders and magnet blocks to form a plurality of block assemblies;

means for sliding each block assembly of said plurality of block assemblies along a rail of said set of rails; initiating with an outermost rail and concluding with an innermost, securing each successively filled rail with a retainer.

30. A reworkable magnetic field generator for a magnetic resonance imaging system comprising:

means for establishing an arrangement for a permanent magnet of a magnet assembly comprising a ferromagnetic yoke plate and a permanent magnet, wherein said arrangement includes a portion of a cavity formed from placement of a portion of a plurality of retainers attached at substantially a perimeter of said yoke plate;

means for populating said first portion of said cavity with a set of rails attached to said yoke plate;

means for affixing a plurality of gliders to a plurality of magnet blocks and magnetizing said gliders and magnet blocks to form a plurality of block assemblies;

means for sliding each block assembly of said plurality of block assemblies along a rail of said set of rails; initiating with an outermost rail and concluding with an innermost, securing each successively filled rail with a retainer; and means for removing one or more retainers of said plurality of retainers and sliding each block assembly of said plurality of block assemblies along a rail of said set of rails off said rail and said yoke plate.

* * * * *